United States Patent
Gardner et al.

[11] Patent Number: 5,874,340
[45] Date of Patent: Feb. 23, 1999

[54] METHOD FOR FABRICATION OF A NON-SYMMETRICAL TRANSISTOR WITH SEQUENTIALLY FORMED GATE ELECTRODE SIDEWALLS

[75] Inventors: Mark I. Gardner, Cedar Creek; Derick J. Wristers; H. Jim Fulford, Jr., both of Austin, all of Tex.

[73] Assignee: Advanced Micro Devices, Inc., Sunnyvale, Calif.

[21] Appl. No.: 682,238

[22] Filed: Jul. 17, 1996

[51] Int. Cl.[6] .................................................. H01L 21/336
[52] U.S. Cl. ............................ 438/286; 438/305; 438/595
[58] Field of Search ..................................... 438/286, 305, 438/306, 307, 175, 190, 585, 595

[56] References Cited

U.S. PATENT DOCUMENTS

| | | | |
|---|---|---|---|
| 4,225,875 | 9/1980 | Ipri | 257/353 |
| 4,272,881 | 6/1981 | Angle | 438/284 |
| 4,927,777 | 5/1990 | Hsu et al. | 438/305 |
| 5,036,017 | 7/1991 | Noda | 438/286 |
| 5,073,514 | 12/1991 | Ito et al. | 438/305 |
| 5,132,753 | 7/1992 | Chang et al. | 257/655 |
| 5,171,700 | 12/1992 | Zamanian | 438/305 |
| 5,200,358 | 4/1993 | Bollinger et al. | 438/286 |
| 5,286,664 | 2/1994 | Horiuchi | 438/286 |
| 5,296,398 | 3/1994 | Noda | 438/179 |
| 5,349,225 | 9/1994 | Redwine et al. | 257/336 |
| 5,364,807 | 11/1994 | Hwang | 438/286 |
| 5,366,915 | 11/1994 | Kadama | 438/257 |

(List continued on next page.)

FOREIGN PATENT DOCUMENTS

| | | |
|---|---|---|
| 0 160 255 | 11/1985 | European Pat. Off. . |
| 0 186 058 | 7/1986 | European Pat. Off. . |
| 0 187 016 A2 | 7/1986 | European Pat. Off. . |
| 0 575 099 A1 | 12/1993 | European Pat. Off. . |
| 56-104470 | 8/1981 | Japan .................................... 438/190 |
| 61-194777 | 8/1986 | Japan . |
| 1-251669 | 10/1989 | Japan .................................... 438/175 |
| 1-18762 | 1/1992 | Japan . |
| 08078672 | 3/1996 | Japan . |

OTHER PUBLICATIONS

Codella et al, H986, "Field Effect Transistor with Asymmetrical Structure", U.S. Statutory Invention Registration, Nov. 5, 1991.

"Process for Making Very Small, Asymmetric, Field–Effect Transistors"; 700 IBM Technical Disclosure Bulletin; vol. 30, No. 3; Armonk, New York, USA; Aug., 1987; pp. 1136–1137.

"Low Series Resistance Source by Spacer Methods"; 700 IBM Technical Disclosure Bulletin; vol. 33, No. 1A; Armonk, New York, USA; Jun., 1990, pp. 75–77.

*Primary Examiner*—Michael Trinh
*Attorney, Agent, or Firm*—Skjerven, Morrill, MacPherson, Franklin & Friel, L.L.P.

[57] ABSTRACT

The method for fabrication of a non-symmetrical IGFET of the present invention includes providing a semiconductor substrate having an insulating film and a gate material. A first portion of the gate material overlying a first region of the semiconductor substrate is removed forming a first sidewall of a gate electrode A dopant is implanted into the first region after forming the first sidewall. After the first region is implanted, a second portion of the gate material overlying a second region of the semiconductor substrate is then removed forming a second sidewall of the gate electrode. A dopant is implanted into the second region after forming the second sidewall. Spacers are formed adjacent to each of the sidewalls of the gate electrode. Then, a dopant is then implanted into portions of the first and second regions of the semiconductor substrate outside the gate electrode and the spacers. In one embodiment of the invention, the first region is a heavily doped source region and the second region is a lightly doped drain region. In another embodiment of the present invention the first region is a lightly doped drain region and the second region is a heavily doped source region. In both embodiments, a part of the lightly doped drain region is retained beneath a spacer.

23 Claims, 6 Drawing Sheets

U.S. PATENT DOCUMENTS

| | | | |
|---|---|---|---|
| 5,397,715 | 3/1995 | Miller | 438/268 |
| 5,424,229 | 6/1995 | Oyamatsu | 438/305 |
| 5,424,234 | 6/1995 | Kwon | 438/305 |
| 5,436,482 | 7/1995 | Ogoh | 257/344 |
| 5,451,807 | 9/1995 | Fujita | 257/404 |
| 5,510,279 | 4/1996 | Chien et al. | 438/305 |
| 5,512,503 | 4/1996 | Hong | 438/266 |
| 5,518,940 | 5/1996 | Hodate et al. | 438/151 |
| 5,521,417 | 5/1996 | Wada | 257/390 |
| 5,525,552 | 6/1996 | Huang | 438/297 |
| 5,547,885 | 8/1996 | Ogoh | 438/286 |
| 5,547,888 | 8/1996 | Yamazaki | 438/279 |
| 5,578,509 | 11/1996 | Fujita | 438/286 |
| 5,585,293 | 12/1996 | Sharma et al. | 438/261 |
| 5,585,658 | 12/1996 | Mukai et al. | 257/344 |
| 5,607,869 | 3/1997 | Yamazaki | 438/286 |

METHOD FOR FABRICATION OF A NON-SYMMETRICAL TRANSISTOR WITH SEQUENTIALLY FORMED GATE ELECTRODE SIDEWALLS

BACKGROUND OF THE INVENTION

1. Field of the Invention

The present invention relates to integrated circuits, and more particularly to lightly doped drain insulated-gate field-effect transistors.

2. Description of Related Art

An insulated-gate field-effect transistor (IGFET), such as a metal-oxide semiconductor field-effect transistor (MOSFET), uses a gate electrode to control an underlying surface channel joining a source and a drain. The channel, drain and source are located in a semiconductor substrate, with the substrate being doped oppositely to the drain and source. The gate electrode is separated from the semiconductor substrate by a thin insulating layer such as a gate oxide. The operation of the IGFET involves application of an input voltage to the gate electrode, which sets up a transverse electric field in the channel in order to modulate the longitudinal conductance of the channel.

In typical IGFET processing, the source and drain are formed by introducing dopants of a second conductivity type (P or N) into the semiconductor substrate of a first conductivity type (N or P) using a patterned gate as a mask. This self-aligning procedure tends to improve packing density and reduce parasitic overlap capacitances between the gate electrode and the source/drain regions. Heavily doped polysilicon (also called polycrystalline silicon, poly-Si or poly) thin films are used as the gate electrode. Since polysilicon has the same high melting point as a silicon substrate, it can be deposited prior to source and drain formation. The polysilicon is anisotropically etched through openings in a photoresist mask to provide a gate electrode which provides a mask during formation of the source and drain by ion implantation. Photolithography is frequently used to create patterns in the photoresist mask that define the gate electrode.

Photolithographic systems often use a radiation source and a lens in conjunction with a mask or reticle to selectively irradiate the photoresist. The radiation source projects radiation through the mask or reticle to the lens, and the lens focuses an image of the mask or reticle onto a wafer. A mask transfers a pattern onto the entire wafer (or another mask) in a single exposure step, whereas a reticle transfers a pattern onto only a portion of the wafer. The three major methods of optically transferring a pattern on a mask or reticle to a photoresist coated wafer include contact printing, proximity printing and projection printing. In general, the term "resolution" describes the ability of an optical system to distinguish closely spaced objects. The minimum resolution of a photolithographic system is the dimension of minimum linewidth or space that the machine can adequately print or resolve. While optical photolithography continues to be the dominant technology because it is well established and is capable of implementing sub-micron resolution of at least 0.35 microns using current equipment, there are incentives for trying to push the current optical photolithography technology into significantly better patterning capabilities for more precise fabrication.

In recent years, with larger and larger scale semiconductor integrated circuit devices (IC's), IGFETs used as circuit elements have become scaled down. This, however, has not been simply accompanied by appropriate supply voltage scaling because interfaces between IC circuit devices must be standardized. As IGFET dimensions are reduced and the supply voltage remains constant (e.g., 3V), the electric field in the gate insulator tends to increase. If the electric field becomes strong enough, it can give rise to so-called hot-carrier effects. For instance, hot electrons can overcome the potential energy barrier between the silicon substrate and the gate insulator thereby causing hot carriers to become injected into the gate insulator. Trapped charge in the gate insulator accumulates over time and can lead to a permanent change in the threshold voltage of the device and premature dielectric breakdown.

A number of techniques have been utilized to reduce hot carrier effects. The voltages applied to the device can be decreased or appropriate drain engineering design techniques, which result in special drain structures that reduce hot electron effects, can be implemented. One such technique is a lightly doped drain (LDD). LDDs absorb some of the potential into the drain and thus reduce the maximum electric field. The drain is typically formed by two ion implants. One of these is self-aligned to the gate electrode, and the other is self-aligned to the gate electrode on which sidewall spacers have been formed. The spacers are typically oxides. The purpose of the lighter first dose is to form a lightly doped region of the drain (or LDD) at the sidewall near the channel, which can reduce the maximum electric field. The second heavier dose forms a low resistivity region of the drain, which is subsequently merged with the lightly doped region. Thereafter, electrical contacts are formed on the heavily doped region. Since the heavily doped region is farther away from the channel than a conventional drain structure, the depth of the heavily doped region can be made somewhat greater without adversely affecting the device characteristics. The lightly doped region is not necessary for the source (unless bi-directional current is used), however LDD structures are typically formed for both the drain and source to avoid the need for an additional masking step.

Disadvantages of LDDs are their increased fabrication complexity compared to conventional drain structures, and parasitic resistance. LDDs exhibit relatively high parasitic resistance due to their light doping levels. During operation, the LDD parasitic resistance can decrease drain current, which in turn may reduce the speed of the IGFET. The saturation drain current is affected little by the parasitic resistance of the drain region and greatly by the effective gate voltage drop due to the parasitic resistance of the source region. Reduction of the drain current can, therefore, be decreased by implementation of an non-symmetrical LDD-IGFET with a lightly doped region only at the drain. However, a non-symmetrical LDD-IGFET can further increase fabrication complexity.

One method for non-symmetrical LDD-MOSFET fabrication is U.S. Pat. No. 5,424,229 entitled "Method For Manufacturing MOSFET Having An LDD Structure" (Oyamatsu) which includes masking the substrate before the gate electrode is formed and leaving a window open in the mask. The lightly doped drain region is then implanted at an angle into the substrate through the window opening. The mask is removed and the gate electrode is formed in the window opening and over a portion of the lightly doped drain region. The heavily doped regions are then formed aligned with the sidewalls of the gate electrode. However, implanting doped regions at an angle into the substrate increases fabrication complexity.

Another method is U.S. Pat. No. 5,286,664 entitled "Method For Fabricating The LDD-MOSFET" (Horiuchi)

wherein the gate electrode is formed and then one half of the gate electrode (on the source side) is masked with a photoresist mask. The lightly doped drain region is implanted. Then a single spacer is formed on the drain side using a liquid phase deposition (LPD) method for depositing silicon dioxide. The mask is then removed and the heavily doped regions are implanted. The LPD method however is not precise and can make controlling the thickness or size of the spacer difficult.

Accordingly, there is a need for a non-symmetrical LDD-IGFET which decreases the parasitic resistance, therefore increasing drain current, yet which can be simply and precisely fabricated.

SUMMARY OF THE INVENTION

In the present invention, a method for fabrication of a non-symmetrical LDD-IGFET is described which reduces fabrication complexity. The method for fabrication of a non-symmetrical IGFET of the present invention includes providing a semiconductor substrate having an insulating film and a gate material. The first and second sidewalls of the gate electrode are formed in sequence. A first portion of the gate material overlying a first region of the semiconductor substrate is removed forming a first sidewall of a gate electrode A dopant is implanted into the first region after forming the first sidewall. After the first region is implanted, a second portion of the gate material overlying a second region of the semiconductor substrate is then removed forming a second sidewall of the gate electrode. A dopant is implanted into the second region after forming the second sidewall. Spacers are formed adjacent to each of the sidewalls of the gate electrode. Then, a dopant is implanted into portions of the first and second regions of the semiconductor substrate outside the gate electrode and the spacers.

In one embodiment of the invention, the first region is a heavily doped source region aligned with the first sidewall of the gate electrode and the second region is a lightly doped drain region aligned with the second sidewall of the gate electrode. A part of the lightly doped drain region is retained beneath the spacer adjacent to the second sidewall when the dopant is implanted into portions of the first and second regions outside the gate electrode and the spacers.

In another embodiment of the present invention the first region is a lightly doped drain region aligned with the first sidewall of the gate electrode and the second region is a heavily doped source region implanted after the lightly doped drain region and aligned with the second sidewall of the gate electrode. The masking film which is used when etching the second sidewall of the gate electrode is also used to mask the lightly doped drain region when implanting the heavily doped source region aligned with the second sidewall. A part of the lightly doped drain region is retained beneath the spacer adjacent to the first sidewall when the dopant is implanted into portions of the first and second regions outside the gate electrode and the spacers.

In the present fabrication method, the step to remove the superfluous spacer is eliminated. Therefore, the advantages described for non-symmetrical LDD-IGFETs are achieved and fabrication complexity reduced. The present invention for fabrication of a non-symmetrical LDD IGFET also provides a shorter channel length than traditional IGFETs by forming each sidewall of the gate electrode in sequence, therefore enhancing speed performance and drive current while maintaining reliability.

These and other features and advantages of the invention will be further described and more readily apparent from a review of the detailed description of the preferred embodiments which follow.

BRIEF DESCRIPTION OF THE DRAWINGS

The following detailed description of the preferred embodiments can best be understood when read in conjunction with the following drawings, in which.

DETAILED DESCRIPTION OF THE PREFERRED EMBODIMENTS

In the drawings, depicted elements are not necessarily drawn to scale and like or similar elements may be designated by the same reference numeral throughout the several views.

Figure 1A:
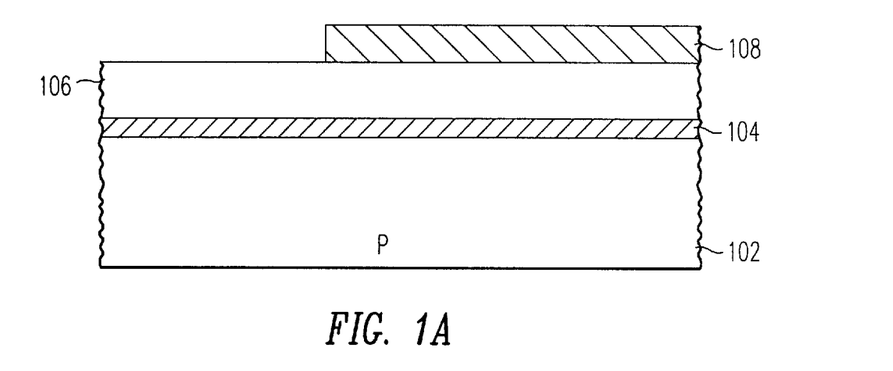
FIGS. 1A–1H show cross-sectional views of successive process steps for formation of a non-symmetrical LDD IGFET in accordance with a first embodiment of the invention.

FIGS. 1A–1H show cross-sectional views of successive process steps for formation of a non-symmetrical LDD IGFET in accordance with a first embodiment of the invention. In FIG. 1A, a gate material 106, such as a polysilicon film, is disposed on a gate oxide 104, which is an insulating film, which in turn is disposed on a semiconductor substrate 102 suitable for integrated circuit manufacture. For instance, substrate 102 includes an 8 micron thick P-type planar epitaxial surface layer with a <100> orientation and a resistivity of 12 ohm-cm. Preferably, the epitaxial surface layer is disposed on a P+ base layer (not shown). A blanket layer of gate oxide 104 (such as $SiO_2$) is formed on the top surface of substrate 102 using tube growth at a temperature of 700° to 1,000° C. in an $O_2$ ambient. Gate oxide 104 has a thickness in the range of 30 to 200 angstroms. Thereafter, a blanket layer of gate material 106, such as polysilicon, is deposited by low pressure chemical vapor deposition (LPCVD) on the top surface of gate oxide insulating film 104. The gate material 106 has a thickness in the range of 250 to 4,000 angstroms. The gate material 106 is doped by ion implantation of arsenic at a dose in the range of $1 \times 10^{15}$ to $5 \times 10^{15}$ atoms/cm and an energy in the range of 2 to 50 kiloelectron-volts. Alternatively, if desired, gate material 106 can be doped by a subsequent source/drain implant. A first masking film 108, such as a photoresist film, is coated over a part of the top surface of gate material 106 for defining a first sidewall of a gate electrode of the IGFET.

Figure 1B:
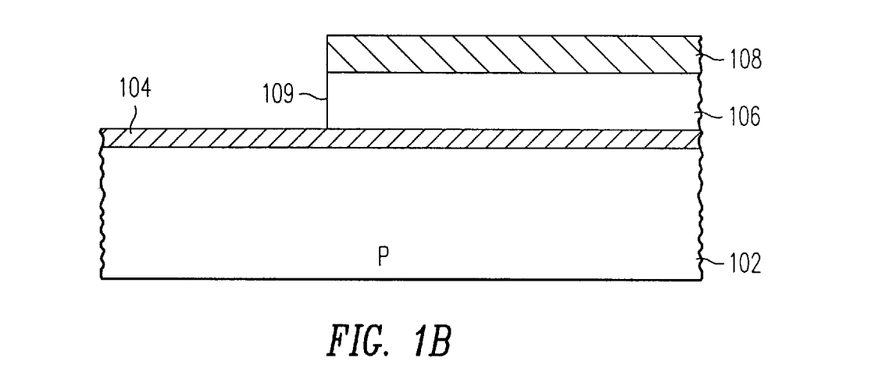

In FIG. 1B, the gate material 106 is etched to provide a first sidewall 109 of a gate electrode of the IGFET. Preferably, an etchant is applied that is highly selective of a gate material 106 such as polysilicon. An alternative embodiment of the method (not shown) is to etch the gate oxide 104 also by using a second etchant that is highly selective of oxides.

Figure 1C:
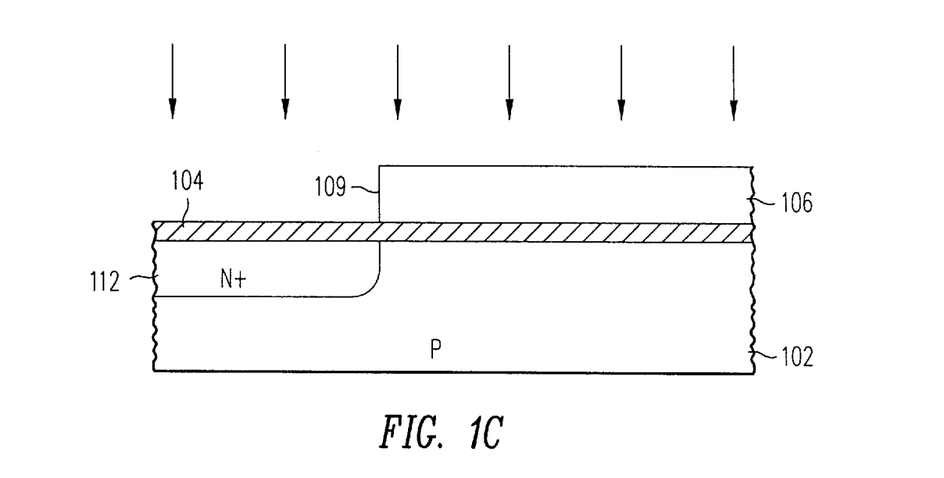

In FIG. 1C, the first masking film 108 is removed and a heavily doped N+ source region 112 is formed in substrate 102 using the gate material 106 as an implant mask. The implant is performed using arsenic at a dosage of $1 \times 10^{15}$ to $5 \times 10^{15}$ atoms/cm and an energy in the range of 2 to 50 kiloelectron-volts. As a result, the heavily doped source region 112 has an arsenic concentration in the range of $1 \times 10^{18}$ to $1 \times 10^{19}$ atoms/cm$^3$, and a depth in the range of 0.02 to 0.3 microns. The heavily doped source region 112 is substantially laterally aligned with the first sidewall 109 of the gate material 106. An alternative embodiment of the method (not shown) is to remove the first masking film 108 after formation of the heavily doped source region 112 wherein the first masking film 108 is used as an implant mask during formation of the heavily doped source region 112.

Figure 1D:
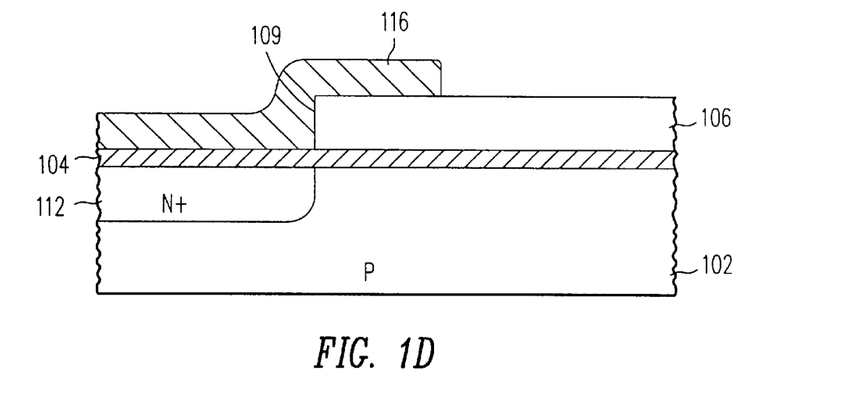

In FIG. 1D, a second masking film 116, such as a photoresist film, is formed over the heavily doped source region 112 and also covers the first sidewall 109 of the gate material 106 and at least a part of the top surface of the gate material 106.

Figure 1E:
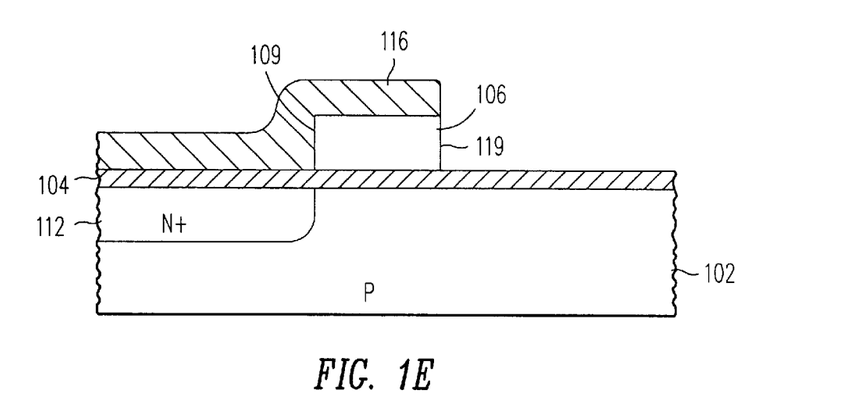

As shown in FIG. 1E, the gate material 106 is etched to provide a second sidewall 119 of a gate electrode. Preferably, a etchant is applied that is highly selective of a gate material 106 such as polysilicon. An alternative embodiment of the method (not shown) is to etch the gate oxide 104 also by using a second etchant that is highly selective of oxides. After etching occurs, the gate material 106 includes opposing vertical sidewalls 109 and 119, defining a gate electrode. In the standard IGFET, the channel length of a gate electrode is in the range of 0.35 to 0.40 microns, however, in the present invention wherein the sidewalls 109 and 119 are formed in sequence an advantage is obtained whereby the channel length range is reduced beneath this range. See, for example, U. S. patent application, Ser. No. 08/682,233, U.S. Pat. No. 5,801,088, entitled "Method Of Forming A Gate Electrode For An IGFET", (Gardner et al), filed concurrently herewith and incorporated by reference, which describes a method for forming the edges of a gate electrode in sequence, rather than simultaneously, using optical photolithography technology, which provides extremely narrow gate electrode lengths (or channel lengths). See also, U. S. Pat. No. 5,672,531, entitled "Method For Fabrication Of A Non-Symmetrical Transistor", (Gardner et al), filed concurrently herewith and incorporated by reference, which describes a method for fabricating a non-symmetrical LDD-IGFET wherein the edges of the gate electrode are formed in sequence, rather than simultaneously.

Figure 1F:
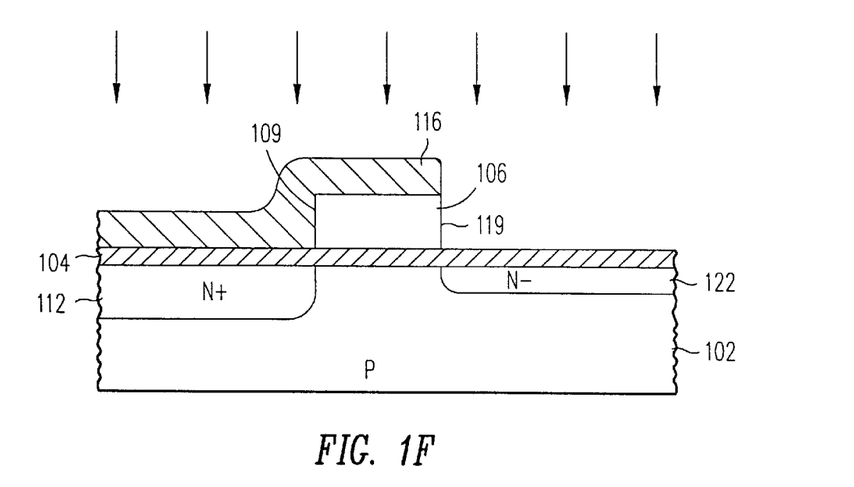

In FIG. 1F, a lightly doped N- drain region 122 is formed in substrate 102 using the gate material 106 and second masking film 116 as implant masks. For instance, the structure is subjected to ion implantation of arsenic or phosphorus at a dose in the range of $1 \times 10^{13}$ to $5 \times 10^{14}$ atoms/cm$^2$ and an energy in the range of 2 to 50 kiloelectron-volts. As a result, a lightly doped drain region 122 is formed in and below the surface of substrate 102. Lightly doped drain region 122 is doped N- with a dopant concentration in the range of about $1 \times 10^{17}$ to $1 \times 10^{18}$ atoms/cm$^3$, and a junction depth in the range of 0.01 to 0.15 microns. Furthermore, the lightly doped drain region 122 is substantially laterally aligned with the second sidewall 119 of gate material 106. The lightly doped drain region 122 provides a portion of the drain. After the lightly doped drain region 122 is formed, the second masking film mask 116 is removed. An alternative embodiment of the method (not shown) is to remove the second masking film 116 before formation of the lightly doped drain region 122.

Figure 1G:
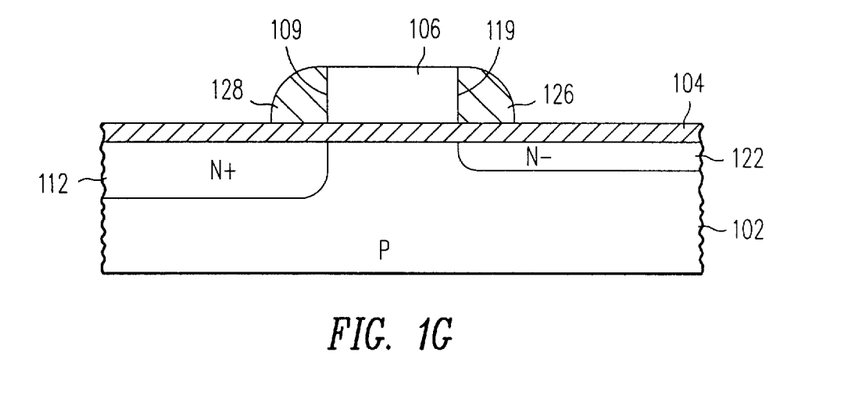

In FIG. 1G, insulating spacers are formed on both sidewalls 109 and 119 of gate material 106. For instance, a layer of oxide (such as SiO$_2$) is formed (not shown) on the whole surface of the resultant structure. The silicon oxide film is etched, by reactive ion etching, to form oxide spacers 126 and 128 adjacent the sidewalls 119 and 109, respectively, of gate material 106. Oxide spacers 126 and 128 each extend a lateral distance in the range of 200 to 2000 angstroms, and have essentially the same height as gate material 106.

Figure 1H:
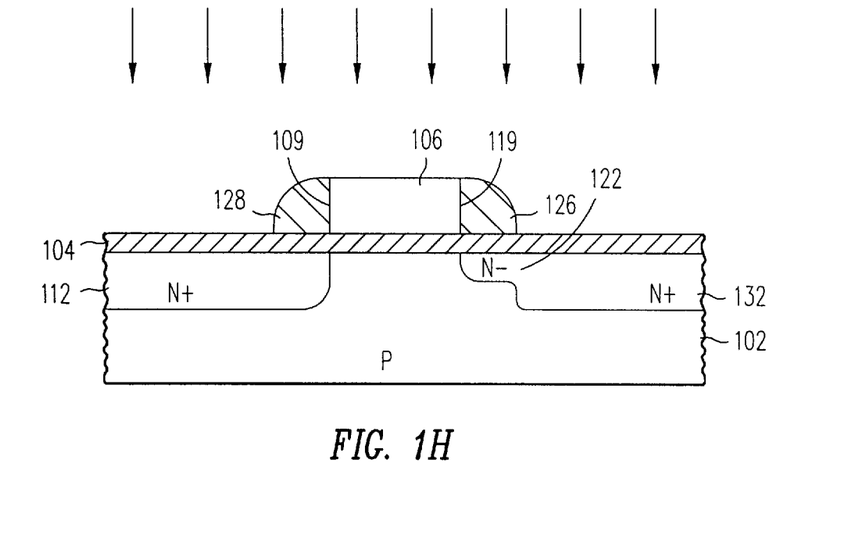

In FIG. 1H, a heavily doped N+ drain region 132 is formed in the substrate 102 using the gate material 106 and spacers 126 and 128 as implant masks. The implant is performed using arsenic at a dosage of $1 \times 10^{15}$ to $5 \times 10^{15}$ atoms/cm$^2$ and an energy in the range of 2 to 50 kiloelectron-volts. As a result, heavily doped drain region 132 has an arsenic concentration in the range of $1 \times 10^{18}$ to $1 \times 10^{19}$ atoms/cm$^3$, and a depth in the range of 0.02 to 0.3 microns. Preferably, heavily doped drain region 132 is implanted with a substantially greater energy, and therefore has a substantially greater depth than lightly doped drain region 122. Furthermore, the heavily doped drain region 132 is substantially laterally aligned with the outside edge of spacer 126, therefore, a portion of the lightly doped drain region 122 is retained beneath spacer 126. The heavily doped implantation performed for the heavily doped drain region 132 will also affect the heavily doped source region 112. The implantation adds more dopant to the heavily doped source region 112 which in turn lowers the resistance in the heavily doped source region 112.

The primary difference between the first embodiment and the second embodiment of the present invention is that in the first embodiment, a lightly doped drain region is implanted after the heavily doped source region has been implanted and in the second embodiment the lightly doped drain region is implanted first.

Unless otherwise noted, the elements for the second embodiment (e.g., substrate 202, gate oxide 204, etc.) are similar to elements of the first embodiment (e.g., substrate 102, gate oxide 104, etc.), and the description of related elements and process steps need not be repeated.

Figure 2A:
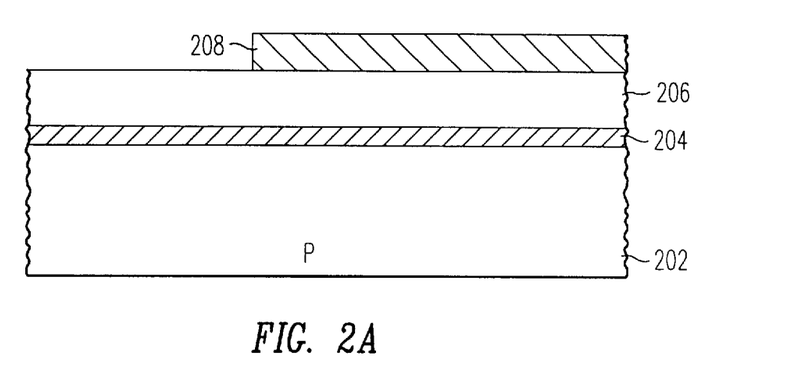
FIGS. 2A–2H show cross-sectional views of successive process steps for formation of a non-symmetrical LDD IGFET in accordance with a second embodiment of the invention.
Figure 2B:
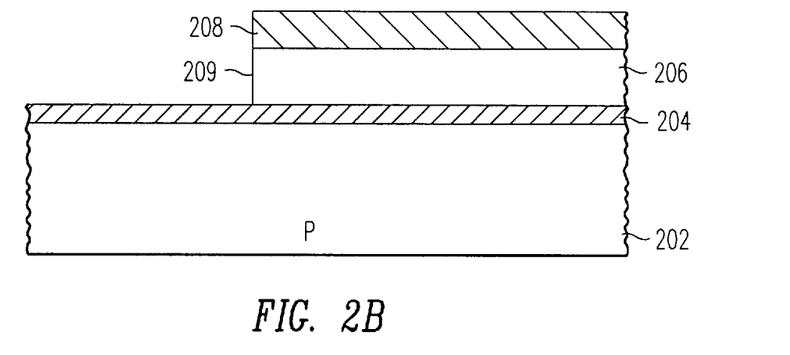

FIGS. 2A–2H show cross sectional views of successive process steps for formation of a non-symmetrical LDD-IGFET in accordance with a second embodiment of the invention. In FIG. 2A, gate oxide 204 is disposed on substrate 202, and gate material 206 is disposed on gate oxide 204. A first masking film 208, such as a photoresist film, is coated over a part of the top surface of gate material 206 for defining a first sidewall of a gate electrode of the IGFET. In FIG. 2B, the gate material 206 is etched to provide a first sidewall 209 of a gate electrode of the IGFET. An alternative embodiment of the method (not shown) is to etch the gate oxide 204 also.

Figure 2C:
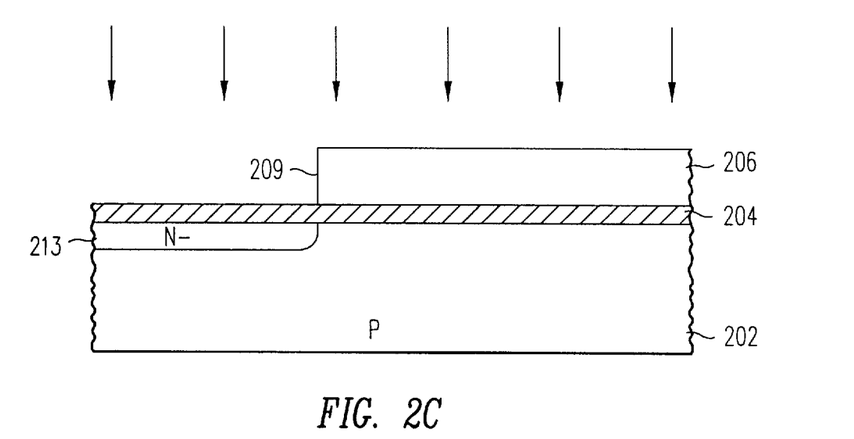

In FIG. 2C the first masking film 208 is removed and a lightly doped drain region 213 is formed in substrate 202 using the gate material 206 as an implant mask. For instance, the structure is subjected to ion implantation of arsenic or phosphorus at a dose in the range of $1 \times 10^{13}$ to $5 \times 10^{14}$ atoms/cm$^2$ and an energy in the range of 2 to 50 kiloelectron-volts. As a result, a lightly doped drain region 213 is formed at and below the surface of substrate 202. Lightly doped drain region 213 is doped N- with a dopant concentration in the range of about $1 \times 10^{17}$ to $1 \times 10^{18}$ atoms/cm$^3$, and a junction depth in the range of 0.01 to 0.15 microns. Furthermore, the lightly doped drain region 213 is substantially laterally aligned with the first sidewall 209 of gate material 206. The lightly doped drain region 213 provides a portion of the drain for the IGFET. An alternative embodiment of the method (not shown) is to remove the first masking film 208 after formation of the lightly doped drain region 213.

Figure 2D:
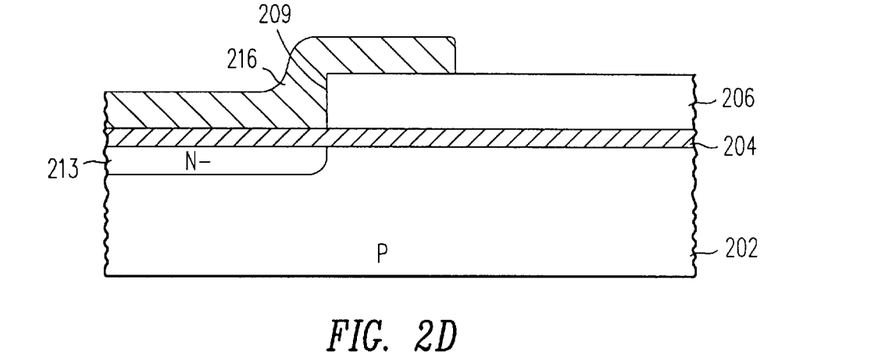

In FIG. 2D, a second masking film 216, such as a photoresist film, is formed over the lightly doped drain region 213, and covers the first sidewall 209 of the gate material 206 and at least a part of the top surface of the gate material 206.

Figure 2E:
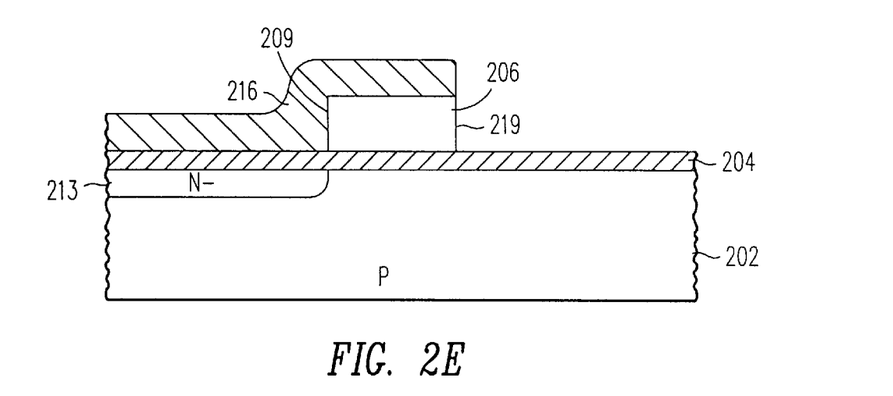

As shown in FIG. 2E, the gate material 206 is etched to provide a second sidewall 219 of a gate electrode. Preferably, a etchant is applied that is highly selective of a gate material 206 such as polysilicon. An alternative embodiment of the method (not shown) is to etch the gate oxide 204 also by using a second etchant that is highly selective of oxides. After etching occurs, the gate material 206 includes opposing vertical sidewalls 209 and 219. In the standard IGFET, the channel length of a gate electrode is in the range of 0.35 to 0.40 microns, however, in the present invention wherein the sidewalls 209 and 219 are formed in sequence an advantage is obtained whereby the channel length range is reduced beneath this range.

Figure 2F:
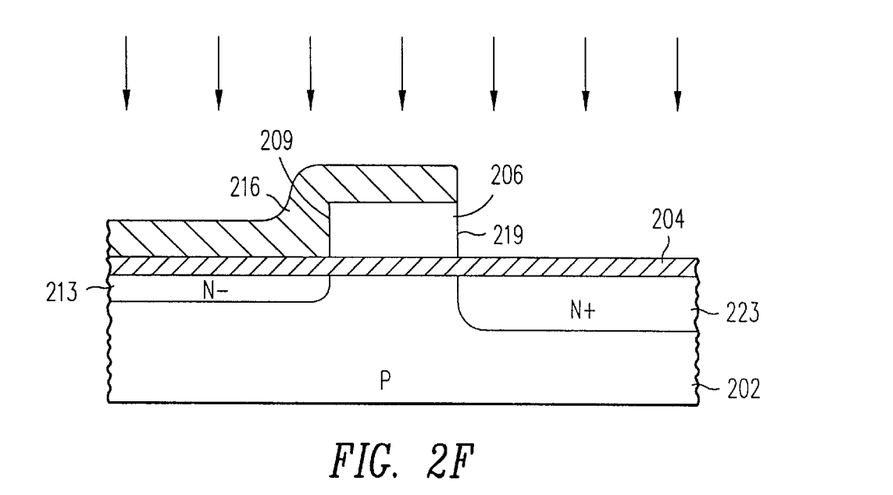

In FIG. 2F, a heavily doped N+ source region 223 is formed in substrate 202 using the gate material 206 and second masking film 216 as implant masks. For instance, the structure is subjected to ion implantation of arsenic at a dosage of $1\times10^{15}$ to $5\times10^{15}$ atoms/cm$^2$ and an energy in the range of 2 to 50 kiloelectron-volts. As a result, the heavily doped source region 223 has an arsenic concentration in the range of $1\times10^{18}$ to $1\times10^{19}$ atoms/cm$^3$, and a depth in the range of 0.02 to 0.3 microns. Furthermore, the heavily doped source region 223 is substantially laterally aligned with the second sidewall 219 of the gate material 206. The heavily doped source region 223 provides the source of the IGFET. After forming heavily doped source region 223, the second masking film 216 is removed. In this second embodiment of the present invention, the second masking film 216 must remain in place during implantation of the heavily doped source region in order to protect the lightly doped drain region.

Figure 2G:
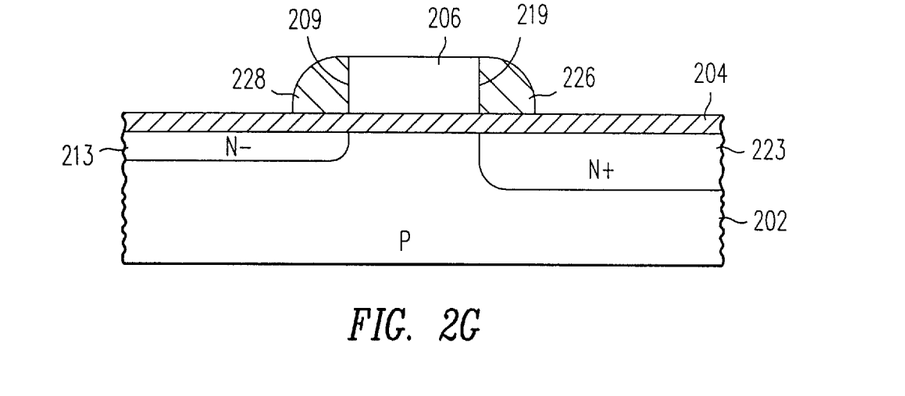

In FIG. 2G, insulating spacers are formed on both sidewalls 209 and 219 of the gate material 206. For instance, a layer of oxide (such as SiO$_2$) is formed (not shown) on the whole surface of the resultant structure. The silicon oxide film is etched, by reactive ion etching, to form oxide spacers 226 and 228 adjacent the sidewalls 219 and 209, respectively, of gate material 206. Oxide spacers 226 and 228 each extend a lateral distance in the range of 200 to 2000 angstroms, and have essentially the same height as gate material 206.

Figure 2H:
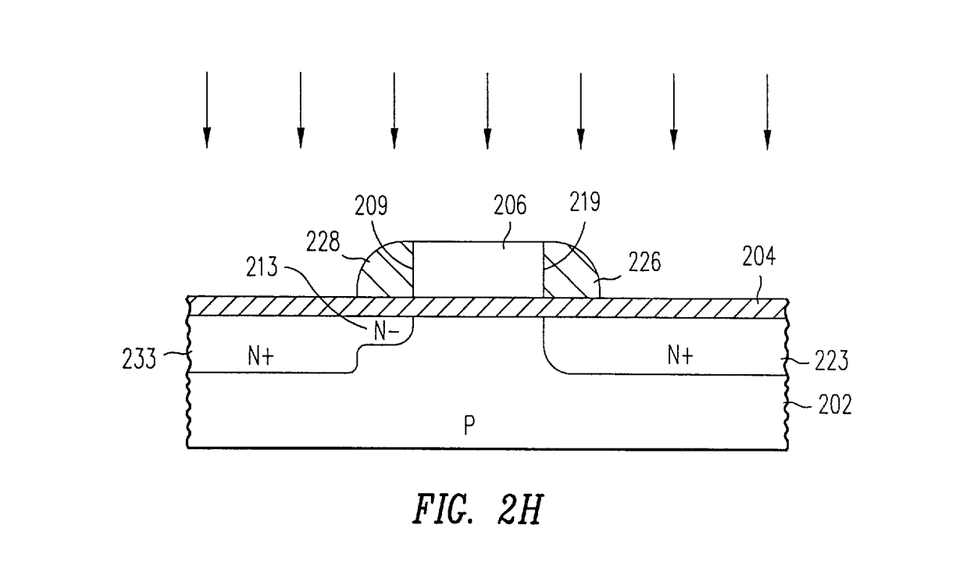

In FIG. 2H, a heavily doped drain region 233 is formed in the substrate 202 using the gate material 206 and spacers 226 and 228 as implant masks. The implant is preferably performed using arsenic at a dosage of $1\times10^{15}$ to $5\times10^{15}$ atoms/cm$^2$ and an energy in the range of 2 to 50 kiloelectron-volts. As a result, heavily doped drain region 233 has an arsenic concentration in the range of $1\times10^{18}$ to $1\times10^{19}$ atoms/cm$^3$, and a depth in the range of 0.02 to 0.3 microns. Preferably, heavily doped drain region 233 is implanted with a substantially greater energy, and therefore has a substantially greater depth than lightly doped drain region 213. Furthermore, the heavily doped drain region 233 is substantially laterally aligned with the outside edge of spacer 228, therefore, a portion of the lightly doped drain region 213 is retained beneath spacer 228. The heavily doped implantation performed for the heavily doped drain region 233 will also affect the heavily doped source region 223. The implantation adds more dopant to the heavily doped source region 223 which in turn lowers the resistance in the heavily doped source region 223.

The present invention is well-suited for forming P-channel MOSFETs as well as N-channel MOSFETs. Boron is a commonly used P-type dopant. Boron tends to diffuse much faster than typical N-type dopants such as arsenic and phosphorus. For typical N-type dopants, the gate oxide insulating film may remain on the surface of the semiconductor substrate. However, when boron is the dopant, the gate oxide insulating film (104 in FIG. 1A and 204 in FIG. 2A) should remain on the surface of the semiconductor substrate during the implantation of the doped regions to impede diffusion of the boron. For instance, for the heavily doped regions the structure is subjected to ion implantation of boron at a dose in the range of $1\times10^{15}$ to $5\times10^{15}$ atoms/cm$^2$ and an energy in the range of 2 to 50 kiloelectron-volts. For the lightly doped region the structure is subjected to ion implantation of boron at a dose in the range of $1\times10^{13}$ to $5\times10^{14}$ atoms/cm2 and an energy in the range of 5 to 50 kiloelectron-volts.

Further processing steps in the fabrication of IGFETs typically include forming a thick oxide layer over the active regions, forming contact windows in the oxide layer to expose the drain, source and gate electrode, forming appropriate interconnect metallization in the contact windows, and forming a passivation layer. These further processing steps are conventional and need not be repeated herein. Likewise the principal processing steps disclosed herein may be combined with other steps readily apparent to those skilled in the art.

The present invention includes variations to the embodiments described above. For instance, the gate electrode can be a conductor such as a metal, the gate insulator and the sidewall spacers can be various dielectrics such as silicon dioxide, silicon nitride or silicon oxynitride. A polysilicon gate electrode can be deposited doped or undoped, and if deposited undoped can be doped at various stages of the process. N-type or P-type dopants can be used in any of the embodiments described above, and the dopants can be activated by applying various combinations of heat and pressure. Suitable N-type dopants include arsenic and phosphorus; suitable P-type dopants include boron, including boron $B_{10}$ and boron $B_{11}$, and BF species such as $BF_2$.

Although only a single FET has been shown for purposes of illustration, it is understood that in actual practice, many devices are fabricated on a single semiconductor wafer as widely practiced in the art. Accordingly, the invention is well-suited for use in an integrated circuit chip, as well as an electronic system including a microprocessor, a memory, and a system bus.

Those skilled in the art will readily implement the steps necessary to provide the structures and methods disclosed herein, and will understand that the process parameters, materials, and dimensions are given by way of example only and can be varied to achieve the desired structure as well as modifications which are within the scope of the invention.

Variations and modifications of the embodiments disclosed herein may be made based on the description set forth herein, without departing from the scope and spirit of the invention as set forth in the following claims.

What is claimed is:

1. A method for fabrication of a non-symmetrical IGFET comprising:

(1) providing a semiconductor substrate;

(2) forming an insulating film on the semiconductor substrate;

(3) forming a gate material on the insulating film;

(4) removing a first portion of the gate material overlying a first region of the semiconductor substrate to form a first sidewall of a gate electrode, wherein the first sidewall of the gate electrode is defined by a first masking film;

(5) implanting a dopant into the first region after forming the first sidewall of the gate electrode;

(6) removing a second portion of the gate material overlying a second region of the semiconductor substrate to form a second sidewall of the gate electrode after implanting the dopant into the first region, wherein the second sidewall of the gate electrode is defined by a second masking film that is formed after removing the first masking film;

(7) implanting a dopant into the second region after forming the second sidewall of the gate electrode;

(8) forming spacers adjacent to each of said first and second sidewalls of the gate electrode; and then (9) implanting a dopant into portions of the first and second regions of the semiconductor substrate outside the gate electrode and the spacers.

2. The method of claim 1 wherein the dopants are n-type.

3. The method of claim 1 wherein the dopants are p-type.

4. The method of claim 1 wherein:

implanting the dopant into the first region in step (5) includes implanting a heavily doped source region substantially aligned with the first sidewall of the gate electrode;

implanting the dopant into the second region in step (7) includes implanting a lightly doped drain region substantially aligned with the second sidewall of the gate electrode; and implanting the dopant into portions of the first and second regions in step (9) includes implanting the dopant substantially aligned with the outside edges of said spacers, wherein the lightly doped drain region beneath the spacer adjacent to the second sidewall of the gate electrode is retained.

5. The method of claim 1 wherein:

implanting the dopant into the first region in step (5) includes implanting a lightly doped drain region substantially aligned with the first sidewall of the gate electrode;

implanting the dopant into the second region in step (7) includes implanting a heavily doped source region substantially aligned with the second sidewall of the gate electrode; and implanting the dopant into portions of the first and second regions in step (9) includes implanting the dopant substantially aligned with the outside edges of said spacers, wherein the lightly doped drain region beneath the spacer adjacent to the first sidewall of the gate electrode is retained.

6. The method of claim 1 wherein removing the first portion of the gate material comprises:

forming, over the top surface of said gate material, said first masking film having an opening which exposes the first portion of the gate material;

etching the first portion of the gate material exposed through the opening in said first masking film to form the first sidewall of the gate electrode; and removing said first masking film.

7. The method of claim 6 wherein the insulating film beneath the first portion of the gate material is etched.

8. The method of claim 6 wherein said first masking film is removed after implanting the dopant into the first region in step (5).

9. The method of claim 6 wherein said first masking film is a photoresist film.

10. The method of claim 1 wherein removing the second portion of the gate material comprises:

forming, over said first region, the first sidewall of the gate electrode and at least a part of the top surface of said gate material, said second masking film having an opening which exposes the second portion of the gate material;

etching the second portion of the gate material exposed through the opening in said second masking film, to form the second sidewall of the gate electrode; and removing said second masking film after implanting the dopant into the second region in step (7).

11. The method of claim 10 wherein said second masking film is removed before implanting the dopant into the second region in step (7) in the event said first region is heavily doped in step (5).

12. The method of claim 10 wherein the insulating film beneath the second portion of the gate material is etched.

13. The method of claim 10 wherein said second masking film is a photoresist film.

14. The method of claim 1 wherein forming the spacers comprises:

depositing an insulating material to cover the surface of the semiconductor substrate, the sidewalls of the gate electrode and the top surface of the gate electrode; and removing said insulating material from the top surface of said gate electrode and from above a portion of the surface of the semiconductor substrate outside and spaced from the gate electrode to form the spacers.

15. The method of claim 14 wherein the insulating material is an oxide.

16. The method of claim 1 wherein the gate material is polysilicon and the insulating film is an oxide.

17. The method of claim 1 including using the IGFET in an integrated circuit chip.

18. The method of claim 1 including using the IGFET in an electronic system that includes a microprocessor, a memory, and a system bus.

19. A method for fabrication of a non-symmetrical IGFET comprising:

providing a semiconductor substrate;

forming a gate oxide on the semiconductor substrate;

forming a polysilicon layer on the gate oxide, wherein the polysilicon layer includes first and second portions;

forming, over the top surface of said polysilicon layer, a first photoresist layer having an opening above the first portion of the polysilicon layer;

etching the first portion of the polysilicon layer through the opening in said first photoresist layer to form a first sidewall of a gate electrode at a location defined by said first photoresist layer;

removing said first photoresist layer;

implanting a heavily doped source region into the semiconductor substrate and substantially aligned with the first sidewall of the gate electrode;

forming, over the heavily doped source region, the first sidewall of the gate electrode and at least a part of the top surface of said polysilicon layer, a second photoresist layer having an opening above the second portion of the polysilicon layer;

etching the second portion of the polysilicon layer through the opening in said second photoresist layer to form a second sidewall of the gate electrode at a location defined by said second photoresist layer;

implanting a lightly doped drain region into the semiconductor substrate and substantially aligned with the second sidewall of the gate electrode;

removing said second photoresist layer after implanting the lightly doped drain region;

depositing an oxide layer to cover the surface of the semiconductor substrate, the sidewalls of the gate electrode and the top surface of the gate electrode;

removing said oxide layer from the top surface of said gate electrode and from above a portion of the surface of the semiconductor substrate outside and spaced from the gate electrode to form spacers adjacent to each of said first and second sidewalls of the gate electrode; and implanting a dopant into portions of the drain and source regions of the semiconductor substrate outside the gate electrode and the spacers and substantially aligned with the outside edges of said spacers, wherein a portion of the drain region is heavily doped and wherein the lightly doped drain region beneath the spacer adjacent to the second sidewall of the gate electrode is retained.

20. The method of claim 19 wherein said first photoresist layer is removed after implanting the heavily doped source region.

21. The method of claim 19 wherein said second photoresist layer is removed before implanting the lightly doped drain region.

22. A method for fabrication of a non-symmetrical IGFET comprising:

providing a semiconductor substrate;

forming a gate oxide on the semiconductor substrate;

forming a polysilicon layer on the gate oxide, wherein the polysilicon layer includes first and second portions;

forming, over the top surface of said polysilicon layer, a first photoresist layer having an opening above the first portion of the polysilicon layer;

etching the first portion of the polysilicon layer through the opening in said first photoresist layer to form a first sidewall of a gate electrode at a location defined by said first photoresist layer;

removing said first photoresist layer;

implanting a lightly doped drain region into the semiconductor substrate and substantially aligned with the first sidewall of the gate electrode;

forming, over the lightly doped drain region, the first sidewall of the gate electrode and at least a part of the top surface of said polysilicon layer, a second photoresist layer having an opening above the second portion of the polysilicon layer;

etching the second portion of the polysilicon layer through the opening in said second photoresist layer to form a second sidewall of the gate electrode at a location defined by said second photoresist layer;

implanting a heavily doped source region into the semiconductor substrate substantially aligned with the second sidewall of the gate electrode;

removing said second photoresist layer after implanting the heavily doped source region;

depositing an oxide layer to cover the surface of the semiconductor substrate, the sidewalls of the gate electrode and the top surface of the gate electrode;

removing said oxide layer from the top surface of said gate electrode and from above a portion of the surface of the semiconductor substrate outside and spaced from the gate to form spacers adjacent to each of said first and second sidewalls of the gate electrode; and implanting a dopant into portions of the drain and source regions of the semiconductor substrate outside the gate electrode and the spacers and substantially aligned with the outside edges of said spacers, wherein a portion of the drain region is heavily doped and wherein the lightly doped drain region beneath the spacer adjacent to the first sidewall of the gate electrode is retained.

23. The method of claim 22 wherein said first photoresist layer is removed after implanting the doped drain region.

* * * * *